United States Patent [19]

Takeuchi et al.

[11] Patent Number: 5,011,732
[45] Date of Patent: Apr. 30, 1991

[54] GLASS CERAMIC SUBSTRATE HAVING ELECTRICALLY CONDUCTIVE FILM

[75] Inventors: Yukihisa Takeuchi; Masayasu Ishikawa, both of Nagoya; Koji Kimura, Komaki, all of Japan

[73] Assignee: NGK Insulators, Ltd., Aichi, Japan

[21] Appl. No.: 380,318

[22] Filed: Jul. 17, 1989

[30] Foreign Application Priority Data

Jul. 26, 1988 [JP] Japan .................. 63-185760

[51] Int. Cl.⁵ .............................................. B32B 9/00
[52] U.S. Cl. ........................... 428/209; 428/210; 428/324; 428/426; 428/428; 428/446; 428/454; 428/702; 428/901; 361/397
[58] Field of Search ............... 428/209, 210, 324, 426, 428/428, 446, 454, 702, 901; 174/68.5; 361/397

[56] References Cited

U.S. PATENT DOCUMENTS

| | | | |
|---|---|---|---|
| 4,227,039 | 10/1980 | Shibasaki et al. | 174/68.5 |
| 4,277,522 | 7/1981 | Dorfeld . | |
| 4,395,445 | 7/1983 | Gebauer et al. | 428/422 |
| 4,678,688 | 7/1987 | Itoh et al. | 528/38 |
| 4,684,960 | 8/1987 | Nishiwaki | 346/76 PH |

FOREIGN PATENT DOCUMENTS

| | | |
|---|---|---|
| 86656 | 8/1983 | European Pat. Off. . |
| 0241304 | 10/1987 | European Pat. Off. . |
| 2004133 | 8/1971 | Fed. Rep. of Germany . |
| 62-238767 | 10/1987 | Japan . |

*Primary Examiner*—Patrick J. Ryan
*Attorney, Agent, or Firm*—Parkhurst, Wendel & Rossi

[57] ABSTRACT

A glass ceramic substrate containing mica and having an electrically conductive film formed thereon includes a bonding layer made of a material including at least silicon oxide, which is formed on a portion of one of the opposite surfaces of the glass ceramic substrate containing mica. The electrically conductive film is formed on the bonding layer and has a major component consisting of at least one element selected from the group consisting of aluminum, tungsten, molybdenum, titanium, tantalum and chromium.

13 Claims, 1 Drawing Sheet

GLASS CERAMIC SUBSTRATE HAVING ELECTRICALLY CONDUCTIVE FILM

BACKGROUND OF THE INVENTION

1. Field of the Invention

The present invention relates generally to a glass ceramic substrate containing mica, on which an electrically conductive film is formed, and more particularly to such a glass ceramic substrate having an electrically conductive film secured thereto with a high degree of adhesion, which substrate permits the electrically conductive film to be formed in a desired pattern with improved accuracy.

2. Discussion of the Prior Art

There has been proposed a glass ceramic substrate containing mica, which has an electrically conductive film formed thereon to provide a conductor circuit or electrodes, or to metallize the substrate to permit soldering or brazing. It is recognized that a glass ceramic substrate containing mica is free of open pores, and has excellent properties in terms of electrical insulation, workability, heat insulation, machinability, resistance to corrosion, and so forth. Hence, the glass ceramic substrate having an electrically conductive film exhibits at least one of these properties of the substrate and certain properties of the conductive film, which combine to enable the substrate to attain its intended purpose. For instance, such a glass ceramic substrate may be used as a discharge panel for display units, or a circuit substrate for an angle transducer or other devices, or a thermal recording head as disclosed in laid-open Publication No. 62-238767 of unexamined Japanese patent application. In the publication, the recording head is adapted to apply an electric current to an ink film for effecting electrothermal printing of images on a recording medium.

However, the conventional glass ceramic substrate as described above suffers from a low degree of adhesion of the electrically conductive film with respect to the substrate. To improve the adhesion of the film, the appropriate surface of the glass ceramic substrate containing mica may be roughened to some extent so that the electrically conductive film adheres firmly to the roughened surface of the substrate. While this method is effective to increase the adhesion of the film to the substrate, there still exists another problem that the roughened surface of the substrate may lead to roughening of the surface of the electrically conductive film, thereby affecting the physical properties and configuration of the electrically conductive film. In patterning the electrically conductive film formed on the glass ceramic substrate containing mica by an etching process, it is difficult to provide a sufficient degree of dimensional accuracy for a desired pattern of the film in the etching process, under some adverse influence of mica incorporated in the substrate, even if the surface of the substrate on which the film is formed remains even (i.e., is not roughened). Where the surface of the substrate is made rough for increased adhesion of the film, it becomes further difficult to provide sufficient dimensional accuracy in a pattern forming process of the electrically conductive film, particularly in respect of straightness of the obtained pattern, because of the roughened surface of the substrate in addition to the influence of mica mentioned above.

SUMMARY OF THE INVENTION

The present invention was developed in the light of the above problems encountered in the prior art. It is therefore an object of the invention to provide a glass ceramic substrate containing mica, which has an electrically conductive film secured thereto with a high degree of adhesion, and in which the formation of a desired pattern obtained from the film is effected with high dimensional accuracy.

The above object may be accomplished according to the principle of the present invention, which provides a glass ceramic substrate containing mica and having an electrically conductive film formed thereon, which comprises a bonding layer made of a material including at least silicon oxide, which is formed on a portion of at least one of the surfaces of the glass ceramic substrate containing mica, the electrically conductive film being formed on the bonding layer and having a major component consisting of at least one element selected from the group consisting of aluminum, tungsten, molybdenum, titanium, tantalum and chromium.

The instant glass ceramic substrate constructed according to the present invention has a high degree of adhesion of the film to the substrate, and excellent workability in the etching process of the film, making the most of the characteristics of the glass ceramic substrate containing mica and those of the electrically conductive film. Therefore, the glass ceramic substrate of the present invention is suitably used as a panel, circuit substrate or printing head used for various purposes.

The present invention was completed based on the following analysis by the inventors upon the conventional glass ceramic substrate having an electrically conductive film formed thereon. It is generally recognized that an electrically conductive film containing at least one element, such as aluminum, tungsten, molybdenum, titanium, tantalum and chromium, adheres relatively well to ordinary glass substrates, but not to glass ceramic substrates containing mica. A research on the cause of this relatively poor adhesion between the film and the mica-containing glass ceramic substrate revealed that bonding strength between mica and glass adjacent to the surface of the substrate, and adhesion strength of the film with respect to mica on the surface of the substrate are both relatively small. The research also revealed that mica on the surface of the substrate deteriorates the straightness or evenness and uniformity of the surface of the substrate, and consequently has adverse influence on the physical properties of the electrically conductive film, resulting in poor dimensional accuracy in patterning the electrically conductive film by etching.

The inventors made a further study based on the analysis described above, and discovered advantages by providing a bonding layer made of a material including silicon oxide such that the bonding layer is formed on a portion of one of the opposite surfaces of the glass ceramic substrate. In this case, the bonding layer is firmly bonded to the surface of the substrate, and at the same time firmly adheres to the electrically conductive film. Thus, there is obtained the glass ceramic substrate provided with the electrically conductive film, which uses the bonding layer to increase the adhesion between the substrate and the electrically conductive film. The provision of the bonding layer including silicon oxide has another advantage. Namely, the bonding layer serves to cover mica which appears on the surface of the substrate, so that the surface of the substrate may be smooth enough to alleviate the adverse influence of mica upon the accuracy of etching of the electrically conductive film. Therefore, the electrically conductive film subjected to the etching process is formed into a desired pattern with high dimensional accuracy. Thus, the glass ceramic substrate having the electrically conductive film constructed as described above has both a high degree of adhesion between the substrate and the film, and high dimensional accuracy of a pattern obtained from the film by the etching process.

The formation of the bonding layer including silicon oxide on a certain portion of the surface of the glass ceramic substrate may be accomplished by a suitable thin-film forming process such as vacuum vapor deposition, sputtering, ion-plating, ionized cluster beam deposition, and CVD (chemical vapor deposition). Alternatively, the surface of the glass ceramic substrate may be first provided or coated with a solution which contains at least a silicon compound, preferably with a solution containing at least one material selected from silicon alkoxide, silicic acid, organic silicon compound, and silicagel, by a suitable method such as spinning, dipping, spraying, or brushing, and then subjected to a suitable heat treatment. It is also possible to employ a suitable printing method in which a paste made of silica glass is printed on the surface of the substrate, and then subjected to the heat treatment. However, it is most preferable to form the bonding layer by the above-described spinning, dipping and other coating method using a solution, in terms of bonding strength of the layer with respect to the substrate, and prevention of cracks which may appear on the bonding layer. Where the bonding layer having a relatively large thickness is formed by the coating method, it is preferred to repeat the process consisting of the coating step using the solution described above and the subsequent heat treatment step, so as to provide the bonding layer having a desired amount of thickness.

The thickness of the bonding layer is preferably selected within a range of 0.1–20 microns, in terms of the adhesion with respect to the substrate and electrically conductive film, patterning accuracy of the film and the evenness or straightness of the substrate. More preferably, the thickness of the bonding layer is selected within a range of 0.3–3 microns so that the surface of the bonding layer may be protected from undesirable cracks.

The bonding layer associated with the present invention is preferably subjected to heat treatment at a temperature within a range of 200°–1000° C., before the electrically conductive film is applied to the bonding layer of the substrate, from the standpoint of adhesion of the layer and evenness of the substrate. More preferably, the heat treatment is effected at a temperature within a range of 400°–800° C. so as to avoid unfavorable cracks which may occur on the bonding layer. This heat treatment is generally effected under the ambient air.

In the present invention, the silicon oxide contained in the bonding layer may be in a state of polycrystal or glass, or in any other state. However, it is preferred that the bonding layer include silicon oxide in the state of glass, because such a bonding layer is less likely to suffer from cracks.

Further, the glass ceramic substrate on which the bonding layer is formed according to the present invention is preferably formed by sintering mica by using a glass as a bonding agent, or by crystallizing a glass by heat treatment to produce mica. While the content of mica included in the glass ceramic substrate is selected depending upon intended purposes and required characteristics of the substrate with the electrically conductive film, the content of mica in the substrate is generally about 30–80% by weight (glass: 70–20% by weight), and is preferably selected within a range of 50–70% by weight (glass: 50–30% by weight).

The electrically conductive film formed on the substrate of the present invention has a major component or components consisting of at least one element selected from the group which includes aluminum, tungsten, molybdenum, titanium, tantalum and chromium. In other words, the film is made of at least one metal selected from the elements indicated above, an alloy which contains at least one of these metal elements, or an electrically conductive compound containing at least one of these elements. Among the above-indicated metals, at least one of the metals selected from the group consisting of tungsten, molybdenum, titanium and chromium, is preferably used to form the electrically conductive film, in terms of ease of etching thereof and its adhesion to the bonding layer. Especially, chromium is preferred. The alloy and compound indicated above may preferably contain nitrogen, and more preferably contain chromium and nitrogen. The formation of the electrically conductive film on the substrate (bonding layer) is effected by a suitable known method, such as vacuum vapor deposition, sputtering, ion-plating, ionized cluster beam deposition, and electroless plating (chemical plating). However, the method for forming the film is not limited to those indicated above, but other methods may be suitably employed.

In fabricating the glass ceramic substrate having the electrically conductive film formed thereon, it is preferable that the film and the bonding layer are subjected to heat treatment after the film is formed on the bonding layer, so as to provide a high degree of adhesion between the film and the bonding layer. In this case, the heat treatment is conducted at a temperature preferably within a range of 500°–1000° C., more preferably within a range of 800°–1000° C. Further, the heat treatment is effected in a non-oxidizing atmosphere so that the electrically conductive film can maintain high conductivity. For example, $N_2$ gas or $(H_2+N_2)$ mixed gas is preferably used as the non-oxidizing atmosphere. It is also possible to convert the metal element of the electrically conductive film into an electrically conductive alloy or compound, by the heat treatment effected in the non-oxidizing atmosphere as described above.

BRIEF DESCRIPTION OF THE DRAWINGS

The above and optional objects, features and advantages of the present invention will be better understood by reading the following detailed description of presently preferred examples, when considered in connection with the accompanying drawings, in which.

DETAILED DESCRIPTION OF THE interposed between the substrate 1 and the pattern 2, respectively.

TABLE 1

| No. | Thickness of bonding layer (μm) | Temperature(1) (°C.) | Material for Conductive film | Temperature(2) (°C.) | Method for forming bonding layer |
| --- | --- | --- | --- | --- | --- |
| 1 | 0 | — | Cr | 900 | — |
| 2 | 0.05 | 600 | Cr | 900 | Dipping |
| 3 | 0.1 | 600 | Cr | 900 | Dipping |
| 4 | 0.3 | 600 | Cr | 900 | Dipping |
| 5 | 1 | 600 | Cr | 900 | Dipping |
| 6 | 3 | 600 | Cr | 900 | Dipping |
| 7 | 6 | 600 | Cr | 900 | Dipping |
| 8 | 20 | 950 | Cr | 900 | Printing |
| 9 | 30 | 950 | Cr | 900 | Printing |
| 10 | 1 | 100 | Cr | 900 | Dipping |
| 11 | 1 | 200 | Cr | 900 | Dipping |
| 12 | 1 | 400 | Cr | 900 | Dipping |
| 13 | 1 | 800 | Cr | 900 | Dipping |
| 14 | 1 | 1000 | Cr | 900 | Dipping |
| 15 | 1 | 600 | Cr | — | Dipping |
| 16 | 1 | 600 | Cr | 500 | Dipping |
| 17 | 1 | 600 | Cr | 800 | Dipping |
| 18 | 1 | 600 | Cr | 900 | Dipping |
| 19 | 1 | 600 | Cr | 1000 | Dipping |
| 20 | 1 | 600 | Mo | 950 | Dipping |
| 21 | 1 | 600 | Cr—Mo | 950 | Dipping |
| 22 | 1 | 600 | Ti | 950 | Dipping |
| 23 | 1 | 600 | W | 950 | Dipping |

(1)Temperature of heat treatment of bonding layer
(2)Temperature of heat treatment of glass ceramic substrate with electrically conductive film

PREFERRED EMBODIMENTS

To further clarify the concept of the present invention, examples of the invention will be described. However, it is to be understood that the invention is not limited to the details of the illustrated examples, but may be embodied with various changes, modifications and improvements which may occur to those skilled in the art, without departing from the spirit and scope of the invention defined in the appended claims.

Figure 1:
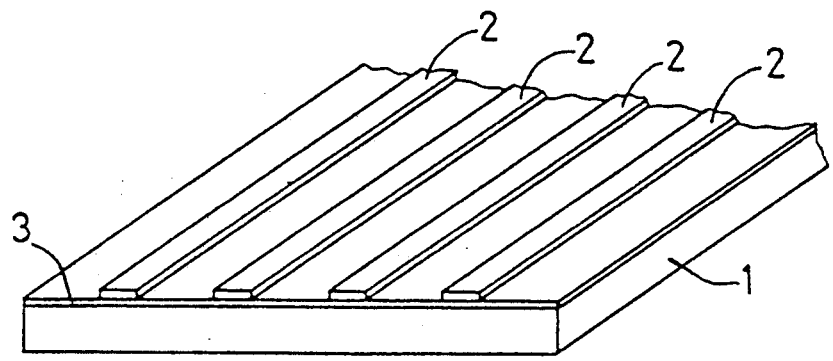
FIG. 1 is a schematic perspective view of a glass ceramic substrate according to one embodiment of the present invention, showing a conductor pattern of a plurality of strips which is formed from an electrically conductive film formed on the substrate.
Figure 2:
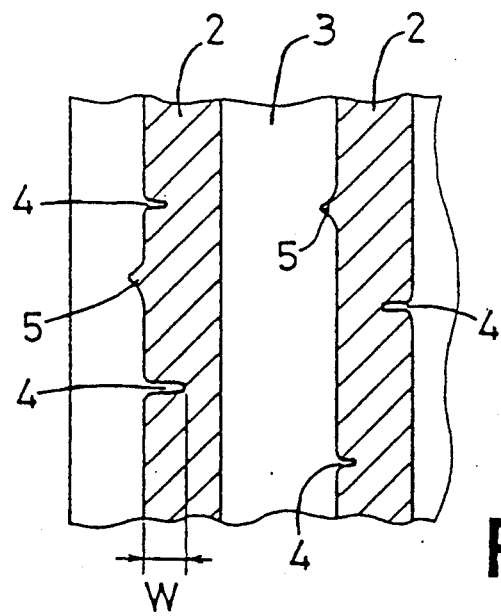
FIG. 2 is a fragmentary view for explaining a way of evaluation of the straightness of the opposite side faces of the strips of the conductor pattern of FIG. 1.

At first, a glass material was heat-treated to prepare glass ceramic substrates whose major components consist of boro-silicate glass and fluorine phlogopite (mica). On the thus prepared substrates, respective bonding layers were formed by a printing method utilizing a paste made of silica glass, or by a dipping method in which the substrate is dipped in a solution whose major component is silicon alkoxide, so that the bonding layers on the substrates had respective thicknesses as indicated in Table 1. The material thus applied to each substrate was then dried, and subjected to heat treatment at a temperature also indicated in Table 1. Thus, there were prepared 22 specimens (Nos. 2-23) of the glass ceramic substrate on which an electrically conductive film will be formed. Subsequently, the electrically conductive film whose major component or components is/are indicated in Table 1 was applied to the surface of the bonding layer on each substrate, by an ordinary magnetron sputtering technique, so that the film had a thickness of 3 microns. Then, the electrically conductive film of each specimen was subjected to a known photo-etching process so as to form a pattern consisting of 100 elongate conductor strips each having a width of 80 microns, as shown in FIG. 1, and then heat-treated in (H$_2$+N$_2$) gas at a temperature indicated in Table 1. Thus, there were obtained 22 specimens (Nos. 2-23) of glass ceramic substrates having the respective patterns of electrically conductive strips according to the present invention. In FIG. 1, reference numerals 1, 2 and 3 designate the glass ceramic substrate containing mica, the above-described conductor pattern (electrically conductive strips), and the bonding layer For inspecting the properties of each specimen of the glass ceramic substrate provided with the electrically conductive pattern, a degree of accuracy in the etching process of the film for forming the strips of the conductive pattern, more specifically, a degree of straightness of the opposite side faces of each of the multiple strips constituting the pattern was observed on each substrate. The degree of straightness was represented by a maximum value (w) of the depths or heights of recessed and projected portions 4, 5, which were formed on the opposite side faces of the 100 strips constituting the pattern as shown in FIG. 2. For observing the adhesion of the electrically conductive film with respect to the substrate, the test pads formed of the electrically conductive film on each substrate were plated for soldering, and flexible print circuits used as peel adhesion test leads were connected to the test pads with a minimum of solder. These flexible print circuits (test leads) were subjected to a peel test in which the circuits (leads) were pulled up at the rate of 20 mm/min., to determine the pull force at which the circuits (leads) were removed from the test pads. The test was carried out by using a universal tension/compression test machine (SV 50 type, available from IMADA SEISAKUSHO, Japan). The result of the test was indicated in Table 2.

It will be understood from Table 2 that the glass ceramic substrate of Comparative Example (specimen No. 1) having no bonding layer had a smaller degree of adhesion of the electrically conductive film with respect to the substrate, and poor straightness, in the pattern obtained from the film, as compared with the glass ceramic substrates (Nos. 2 through 23) constructed according to the present invention. Further, some defects caused by mica included in the substrate were found in the glass ceramic substrate of the Comparative Example.

TABLE 2

| No. | Straightness (μm) | Adhesion (gr) |
|---|---|---|
| Comparative | | |
| 1 | 10.0 | 10 or smaller |
| Present Invention | | |
| 2 | 8.0 | 48 |
| 3 | 7.0 | 53 |
| 4 | 5.0 | 59 |
| 5 | 4.0 | 58 |
| 6 | 4.0 | 55 |
| 7 | 4.0 | 44 |
| 8 | 3.0 | 28 |
| 9 | 3.0 | 24 |
| 10 | 4.0 | 43 |
| 11 | 4.0 | 46 |
| 12 | 4.0 | 51 |
| 13 | 5.0 | 59 |
| 14 | 6.0 | 55 |
| 15 | 4.0 | 33 |
| 16 | 4.0 | 40 |
| 17 | 4.0 | 52 |
| 18 | 4.0 | 58 |
| 19 | 4.0 | 63 |
| 20 | 4.0 | 40 |
| 21 | 4.0 | 45 |
| 22 | 4.0 | 50 |
| 23 | 5.0 | 33 |

What is claimed is:

1. A glass ceramic substrate containing mica, which has an electrically conductive film formed thereon, comprising:
   a bonding layer made of a material including at least silicon oxide, which is formed on a portion of at least one of the surfaces of said glass ceramic substrate containing mica; and
   said electrically conductive film being formed on said bonding layer, and having a major component consisting of at least one element selected from the group consisting of aluminum, tungsten, molybdenum, titanium, tantalum and chromium.

2. A glass ceramic substrate according to claim 1, wherein said bonding layer is formed by applying to said one surface of the glass ceramic substrate a solution which contains at least a silicon compound, and subsequently effecting a heat treatment of said bonding layer, prior to forming said electrically conductive film.

3. A glass ceramic substrate according to claim 2, wherein said heat treatment prior to forming said electrically conductive film is conducted at a temperature within a range of 200°–1000° C.

4. A glass ceramic substrate according to claim 3, wherein said heat treatment is conducted at a temperature within a range of 400°–800° C.

5. A glass ceramic substrate according to claim 1, which is subjected to a heat treatment in a non-oxidizing atmosphere after said electrically conductive film is formed on the substrate.

6. A glass ceramic substrate according to claim 5, wherein said heat treatment after forming said electrically conductive film is conducted at a temperature within a range of 500°–1000° C.

7. A glass ceramic substrate according to claim 6, wherein said heat treatment is conducted at a temperature within a range of 800°–1000° C.

8. A glass ceramic substrate according to claim 1, wherein said bonding layer has a thickness selected within a range of 0.1–20 microns.

9. A glass ceramic substrate according to claim 8, wherein said bonding layer has a thickness selected within a range of 0.3–3 microns.

10. A glass ceramic substrate according to claim 9, wherein said glass ceramic substrate contains 50–70% by weight of mica.

11. A glass ceramic substrate according to claim 1, wherein said electrically conductive film includes chromium.

12. A glass ceramic substrate containing mica in an amount of 30–80 wt %, said substrate having an electrically conductive film formed thereon, said substrate comprising:
    a bonding layer made of a material including at least silicon oxide, which is formed on a portion of at least one of the surfaces of said glass ceramic substrate containing mica; and
    said electrically conductive film being formed on said bonding layer, and having a major component consisting of at least one element selected from the group consisting of aluminum, tungsten, molybdenum, titanium, tantalum and chromium.

13. The glass ceramic substrate of claim 12, wherein said glass ceramic substrate contains 50–70 wt % mica.

* * * * *